United States Patent [19]
Binet et al.

[11] Patent Number: 4,769,591
[45] Date of Patent: Sep. 6, 1988

[54] TESTING APPARATUS FOR LEADLESS PACKAGE CONTAINING A HIGH-FREQUENCY INTEGRATED CIRCUIT CHIP

[75] Inventors: Michel J. M. Binet, Creteil; Didier S. Meignant, Emerainville, both of France

[73] Assignee: U.S. Philips Corporation, New York, N.Y.

[21] Appl. No.: 938,690

[22] Filed: Dec. 5, 1986

[30] Foreign Application Priority Data

Dec. 20, 1985 [FR] France .................................. 85 18925

[51] Int. Cl.[4] .................. G01R 31/02; G01R 1/06
[52] U.S. Cl. ................................ 324/158 F; 324/72.5; 324/158 P
[58] Field of Search ................ 324/158 F, 158 P, 72.5, 324/73 PC; 439/68, 69, 71, 74

[56] References Cited

U.S. PATENT DOCUMENTS

| | | | |
|---|---|---|---|
| 4,574,235 | 3/1986 | Kelly et al. | 324/158 P |
| 4,593,243 | 6/1986 | Lao et al. | 324/158 P |
| 4,686,463 | 8/1987 | Logan | 324/158 P |

*Primary Examiner*—Ernest F. Karlsen
*Attorney, Agent, or Firm*—Robert J. Kraus

[57] ABSTRACT

A testing apparatus for a high-frequency integrated-circuit chip contained in a leadless package, which enables the transmission of signals from n input/output contacts of the chip to measuring apparatus by means of high-frequency lines having a given characteristic impedance. The apparatus comprises a rigid dielectric plate having on a front surface a printed circuit forming a network of n high-frequency coplanar transmission lines having the given characteristic impedance. The apparatus includes first means for connecting n contacts of the package to n inputs of the coplanar transmission lines and second means for connecting n outputs of the transmission lines to coaxial high-frequency lines having the same given impedance, which supply the measuring apparatus.

8 Claims, 4 Drawing Sheets

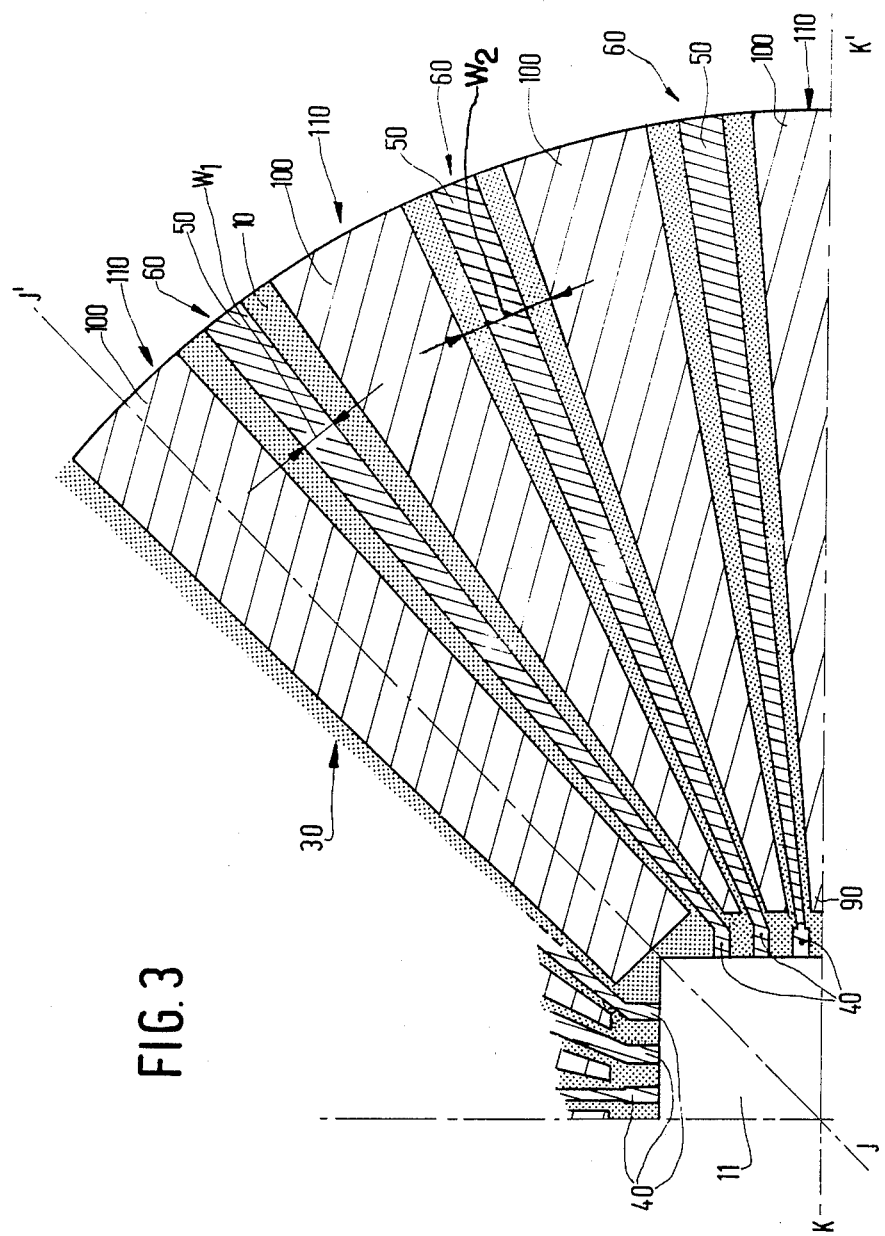

TESTING APPARATUS FOR LEADLESS PACKAGE CONTAINING A HIGH-FREQUENCY INTEGRATED CIRCUIT CHIP

BACKGROUND OF THE INVENTION

The invention relates to a testing apparatus for a leadless package containing a high-frequency integrated circuit chip intended to permit the transmission of signals from n input/output contacts of the package to measuring apparatus by means of high-frequency lines having a given characteristic impedance.

The invention is used in the field of the manufacture of high-frequency integrated circuits.

The term leadless package is to be understood to mean that type of package or envelope better known by those skilled in the art under the designation of "leadless chip carrier". These packages have the property that they can be soldered directly to a peripheral printed circuit by surface mounting. Thus, the wire connections can be dispensed with, which are incompatible with the high-frequency technologies. On the other hand, these packages offer good protection for the integrated circuit chips while maintaining an excellent quality level of the circuits in the case in which they operate in the high-frequency field.

However, before being mounted on a printed circuit board, the leadless package containing the integrated circuit chip must be tested.

Now this operation can be carried out only with great difficulty due to the fact that no leads are present. This operation is further complicated in the case of high-frequency circuits due to the fact that the signals must be transmitted through high-frequency lines having a given characteristic impedance.

On the other hand, there is nowadays a demand among the users for a testing apparatus adapted to each specific circuit. Thus, the manufacturers of integrated circuits have to present in their catalogs this type of testing apparatus, while the circuit designers have to provide for testing apparatus which are marketable, i.e. of a type for a wide public, of simple and inexpensive construction, and also for the circuits themselves.

A testing apparatus for an integrated circuit chip is known from Patent JP-55 72 876 (A) (Fujitsu K.K.). This known apparatus comprises two parts. The first part is constituted by a thick plate of an elastic material, on which a simple conductor circuit is printed, whose geometry permits connecting very compact contacts, which are the image of the input/output contacts of the integrated circuit chip, to conductor contacts of large surface area, which are distributed along the periphery of this elastic plate. The second part is constituted by a rigid socket provided at its central part with a guide hole intended to receive the integrated circuit chip, this hole having a depth smaller than the thickness of the chip. This socket is moreover provided with conductor terminals, of which the geometrical distribution coincides with that of the conductor contacts of large surface area arranged along the periphery of the elastic plate.

The positioning of the chip in such a manner that the circuit faces the exterior in the guide hole of the socket and the pressure of the elastic plate with the conductive surface towards the circuit on the assembly of socket and chip permits establishing the contact between the input/output contacts of the integrated circuit chip and the terminals of the conductors fixed in the rigid socket.

Use of the apparatus described in the aforementioned document therefore consists of connecting an integrated circuit chip directly through an ordinary circuit to measuring apparatus for carrying out the test of the circuit. However, the field of use is not the high-frequency field. The connection conductors which are printed on the thick elastic plate are of the simple conductor type and also of great length, which is incompatible with the transmission of high-frequency signals. This plate has besides its elastic properties no specific dielectric properties. On the other hand, the conductors whose end appears in the rigid socket are not high-frequency lines. None of the elements described in this document provides the possibility of variation, which would permit the transposition to the high-frequency field, while the pure and simple use of such an apparatus is absolutely impossible in this field of use.

Further, the problem solved by the apparatus described in the aforementioned document does not relate to an integrated circuit chip already mounted in a leadless package.

SUMMARY OF THE INVENTION

It is an object of the invention to provide a testing apparatus which on the one hand accepts an integrated circuit chip contained in a leadless package and on the other hand permits the transmission of the high-frequency signals.

According to the invention an apparatus as described in the opening paragraph is characterized in that it comprises a rigid plate of a material having favorable dielectric properties for high-frequency operation, provided at a surface (designated as the front surface) with a printed circuit forming a network of n high-frequency lines according to the coplanar technology having the given characteristic impedance. It also comprises first means for connecting the n contacts of the leadless package to the n inputs of the lines of the coplanar network and second means for connecting the n outputs of the lines of the coplanar network to coaxial high-frequency lines having the same given impedance, which supply the measuring apparatus.

Consequently, the apparatus according to the invention provides a solution to the problems mentioned above. It also affords advantages such as inter alia:

a manner of carrying out the tests which is simple and which will not increase the cost price of the high-frequency circuits which till now is fairly high due to the novelty of these circuits and the inherent difficulties which are not yet solved;

the possibility of being presented in a catalog together with the circuit as a component;

good electrical contacts on each of the test regions;

a good continuity of impedance at high frequencies; this good continuity of impedance is subordinate to the fact that the coupling between the high-frequency lines designed in the apparatus according to the invention for connecting the inputs/outputs of the leadless package to the peripheral measuring apparatus depends upon the pressure between the body of the apparatus and the ground plane surfaces of the high-frequency lines; if the pressure is unadapted, the coupling between these lines is too strong and the measurements are distorted;

a good reproducibility of the measurements.

BRIEF DESCRIPTION OF THE DRAWING

In order that the invention may be readily carried out, it will now be described more fully with reference to the accompanying drawing figures, in which:

FIG. 3 shows an embodiment of a network of coplanar high-frequency lines formed on a rigid plate;

DESCRIPTION OF THE PREFERRED EMBODIMENTS

Figure 1A:
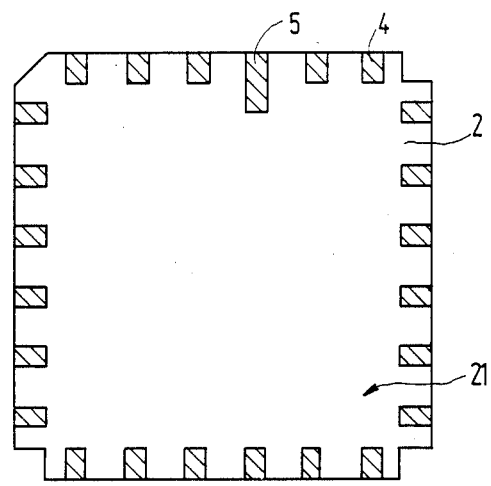
FIGS. 1a–1c show an embodiment of a leadless package FIG. 1a being a front elevation, FIG. 1b being a top sectional view and FIG. 1c being a rear elevation.

FIG. 1a shows the surface 21 of a leadless package 1, which in this embodiment is provided with 24 input-/output contacts 4 and with a supplementary contact 5 that may serve for connection to a ground plane. This package is constituted by an insulating support 2, which for the high-frequency applications may be made of ceramic material.

Figure 1B:
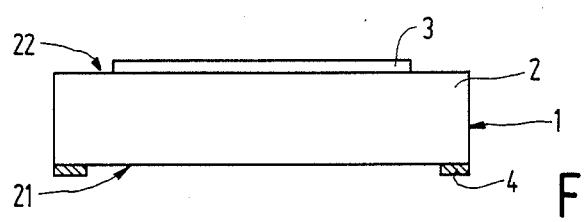
Figure 1C:
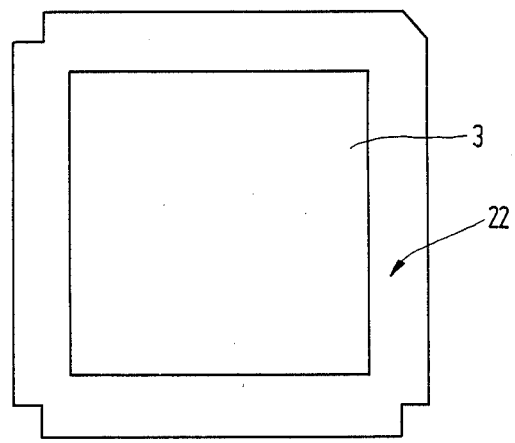

The top sectional view of the package shown in FIG. 1b shows that the contacts 4 (or 5) essentially appear on the surface 21 (designated as front surface) of the package and that the surface 22 (or back surface) (shown in FIG. 1c) is provided with a cap 3 which protects an integrated circuit not shown in the Figures, which is connected to the contacts 4 (or 5).

In the prior art, leadless packages are well known to those skilled in the art and for this purpose reference may be made advantageously to the article of C. Val et al entitled "Chip carrier, support universal de pastilles à haut niveau d'intégration", published in the magazine "L'Electronique Industrielle", No. 31, 1-4-82.

The leadless package envisaged within the scope of the invention is intended to contain a high-frequency integrated circuit chip.

In order to test this high-frequency circuit, the inputs-/outputs of the leadless package must be connected to measuring apparatus by means of high frequency lines having a given characteristic impedance, for example 50Ω.

Since conventional coaxial high-frequency lines cannot be directly connected to the leadless package, the invention provides an intermediate device which permits establishing the connection between the inputs-/outputs of the leadless package and the conventional coaxial high-frequency lines transmitting the signals to the measuring apparatus.

Figure 2:
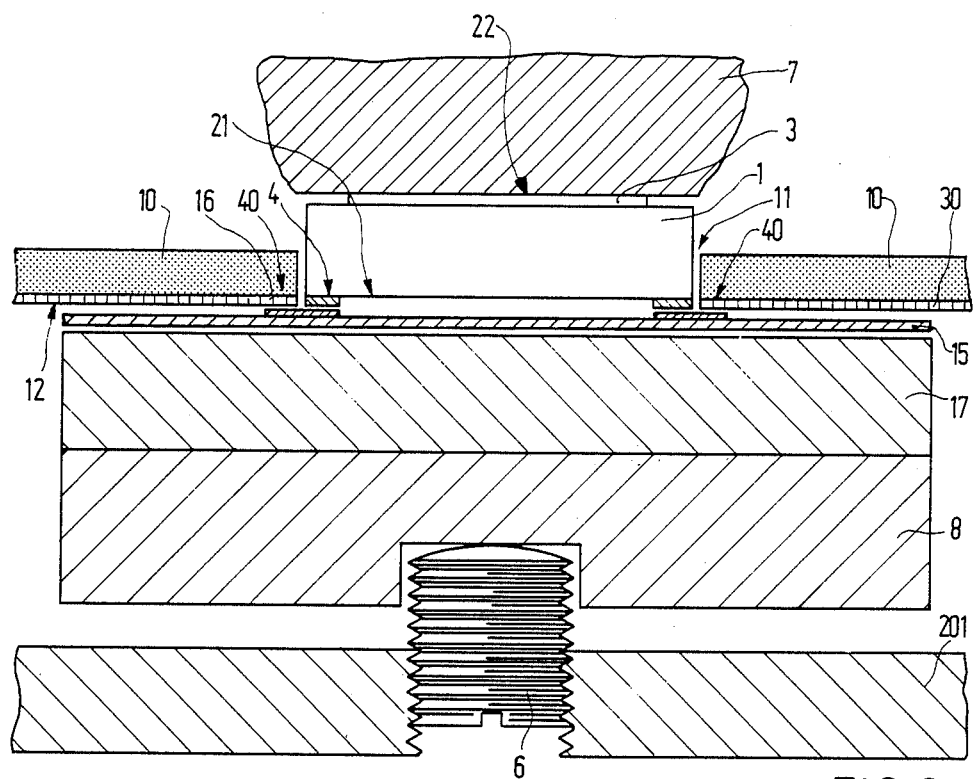
FIG. 2 is a sectional view of a first subassembly constituting the test apparatus.
Figure 5:
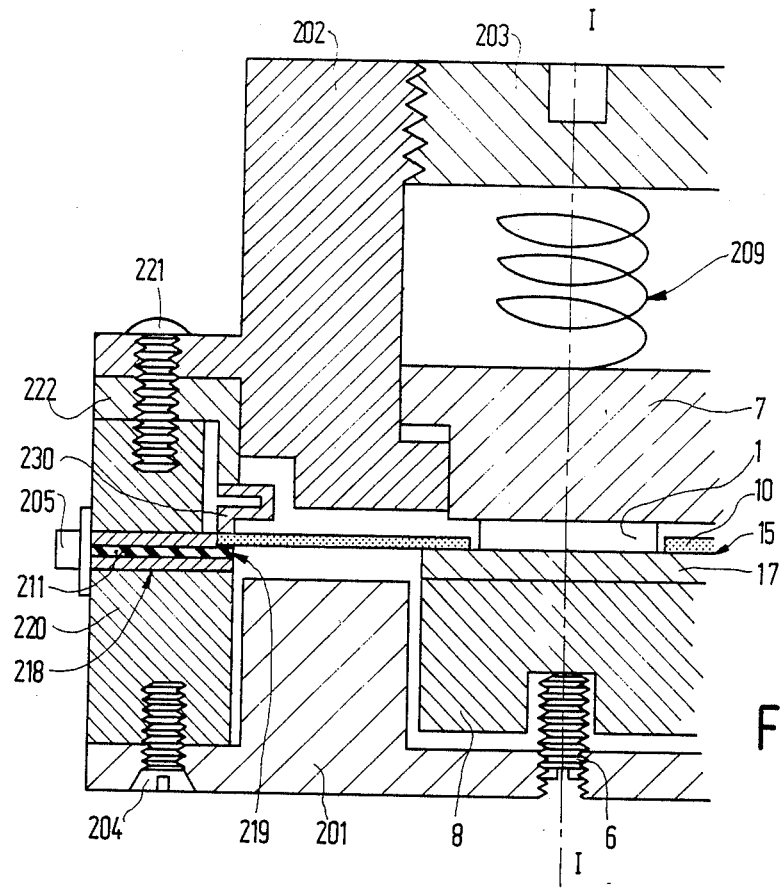
FIG. 5 is a sectional view showing assembly of the various parts of the testing apparatus according to the invention.

The assembly of the testing apparatus according to the invention is shown in sectional views in FIGS. 2 and 5.

This assembly comprises a plate 10 made of a material which must have both rigidity properties and dielectric properties suitable to receive a high-frequency printed circuit 30. In an advantageous manner, this material may be, for example, a ceramic material.

This rigid plate 10 is provided with an opening 11 which traverses it from one side to the other and which has dimensions and a form suitable to allow for the passage without friction for the package 1. This plate 10 is moreover provided with a printed circuit 30 of coplanar lines, of which an embodiment is shown in FIG. 3.

The term "coplanar line" is to be understood to mean a line in the form of a metallized ribbon 50 having a width $W_1$ lying between two large metallized regions 100 constituting part of a ground plane. The metallized ribbon 50 constitutes the central conductor of the high-frequency line and lies in a gap between the ground plane regions having a width $W_2$. The ribbon forming the central conductor and the ground plane regions are formed on the same surface 12 of the rigid plate 10.

The importance of this embodiment of a high-frequency line is very great.

This technology differs from the other high-frequency technologies, such as for example the three-plate or two-wire technologies, in which the conductors and the ground plane are formed on either side of a dielectric plate. Thus, according to the coplanar technology, the characteristic impedance of a high-frequency line depends only upon the ratio $W_1/W_2$ and does not depend, as in the other technologies mentioned above, upon the ratio W/e, where W is the width of the ribbon constituting the central conductor and e is the thickness of the dielectric plate.

It is then easy according to the technology of coplanar lines to form lines having an impedance such as 50 ohms even with narrow lines. Consequently, by means of this technology, a large number of lines having a desired impedance, such as 50Ω, can be disposed to reach the immediate proximity of the opening 11 intended for the passage of the package 1.

A number of lines 50 equal to the number of inputs-/outputs 4 of the package 1 will be chosen and the ends 40 of these lines will preferably be located at projecting parts of these contacts 4 when the package is positioned in the recess 11. In the embodiment of FIGS. 1 and 3, the package 1 is provided with 24 input/output contacts 4. Therefore, 24 lines 50 have also been provided on the plate 10. However, FIG. 3 shows only one-eighth of the printed circuit, of which the other parts are symmetrically located between the axes JJ' and KK'.

Among the input/output contacts of the package, generally a special contact 5 is reserved for contacting the ground plane and therefore the end of a ground plane region is arranged opposite to this contact 5.

However, this distribution is only an embodiment. In another embodiment of distribution of the ribbons 50 and of the ground plane regions 100, each contact of the package could be located opposite to either a central conductor or a ground plane region so that every other contact of the package would be coupled to the ground plane.

Numerous configurations of the coplanar circuit 30 formed on the surface 12 (designated as front surface) of the rigid plate 10 are therefore possible in accordance with the dimensions of the package 1 and the number of inputs/outputs.

Moreover, the plate 10 may be square or circular. In practice, those skilled in the art will readily adopt the square form when the plate 10 comprises a number of lines smaller than 10 and the circular form when the number exceeds 10. This limit value is not imperative at all and the choice is fully left to the user.

The testing apparatus shown in FIG. 5 further comprises a first subassembly shown in FIG. 2 and intended to ensure the connection of the ends 40 and 90 (designated as inputs) of the lines and ground plane regions of the coplanar circuit 30 (FIG. 3) to the input/output contacts 4 (or 5) of the package 1.

Figure 4:
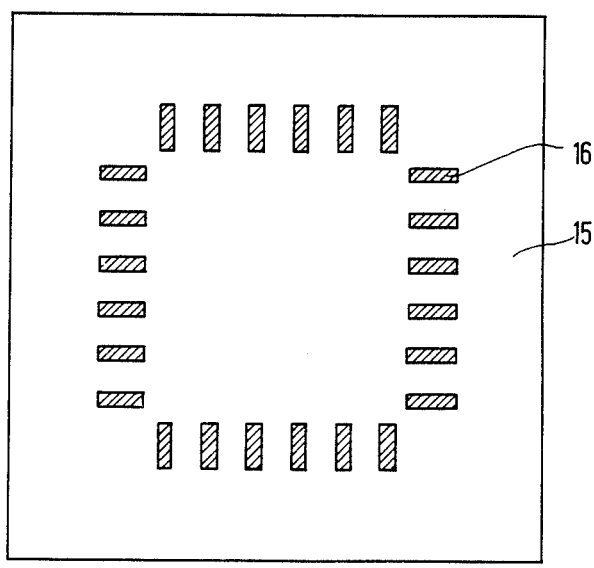
FIG. 4 shows an embodiment of an ultrashort connection formed on a thin and flexible plate for connecting the leadless package to the coplanar high-frequency lines.

For this purpose, the first subassembly is first constituted (cf. FIG. 4) by a printed circuit 16 of extremely short conductors formed on the surface (designated as front surface) of a flexible plate 15 of a good dielectric, for example KAPTON (registered trademark) or MYLAR (registered trademark) dielectric materials or any other dielectric, provided that it has a small thickness and a low permittivity. These extremely short conductors 16 are intended to form the connections between the contacts 4 (or 5) of the package and the ends 40 or 90 of the coplanar lines.

In order to obtain a good electrical contact and a good continuity of impedance, the front surface of the plate 15 is held against the front surface of the rigid plate 10 and against the contacts 4 (or 5) of the envelope, in such a manner that the conductors 16 are located opposite to the circuit 30 and to the contacts 4, by means of a thick plate 17 (cf. FIG. 2) which has both elastic properties and dielectric properties suitable for the high-frequency field., i.e. a low permittivity and low losses. A material favourable for constituting the plate 17 is, for example, natural rubber or alternatively an elastomer.

The pressure by which the electrical contact can be established between these elements is applied by means of a first push-button 8 of a rigid insulating material placed on the other surface of the plate 17 and by means of a second push-button 7 also of a rigid insulating material bearing on the surface 22 of the package. The pressure is finely adjusted by means of the screw 6 acting upon the second surface of the rigid plate 15.

Finally, the ends 60 and 110 (designated as the outputs of the circuit 30) of the plate 10 have to be connected to the high-frequency lines 205, which supply the measuring apparatus. This connection is established by attaching the first subassembly (shown in FIG. 2) provided with the rigid plate 10 and with the package 1 to the second subassembly of the testing apparatus which is shown as a whole in sectional view in FIG. 5.

This second subassembly is first constituted by a socket 201 which serves as a guide for the push-button 8 and for the plate 17 and into which the screw 6 for adjusting the pressure is screwed. This socket 201 may be made of a rigid insulating material such as PLEXIGLAS (registered trademark) plastic material.

It further comprises a bayonet cap 202, which may be made of the same material as the socket 201.

In this cap 202 the push-button 7 is centered, and pressure is applied to the package 1 by means of a spring 209 compressed between the push-button and the pressure adjustment screw 203.

This second subassembly further comprises a metallic body 220 provided from one side to the other at its center with an opening furnished with a shoulder 219. The first subassembly mounted around the package 1 and the rigid plate 10 is arranged in this opening in such a manner that the front surface 12 of the rigid plate 10 bears on the shoulder of the metallic body.

Figure 6:
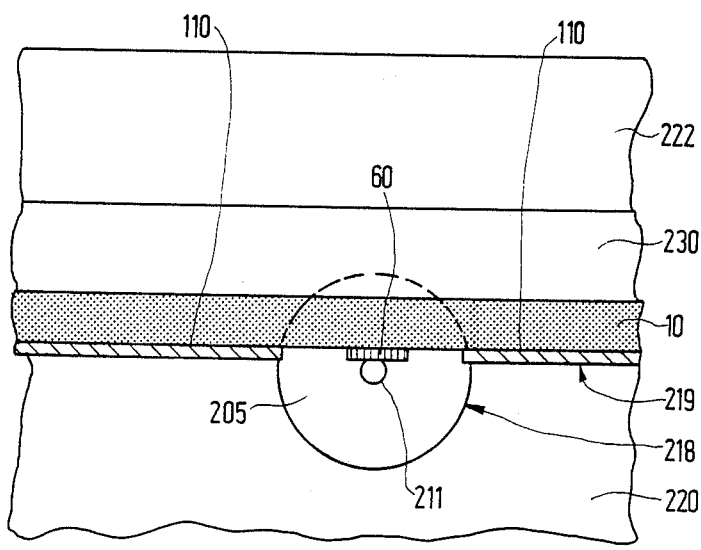
FIG. 6 is a sectional view of the respective site of a coaxial line and of the rigid plate in the body of the apparatus.

This metallic body 220 is moreover provided along its periphery with n circular openings 218, whose centers lie in the same plane and whose diameter is suitable to ensure that these openings serve as recesses for conductors 205 of conventional coaxial high-frequency lines. These openings 18 are distributed along the periphery of the metallic socket according to a geometry such that their centers coincide with the central conductors of the coplanar lines, as shown in sectional view at right angles to a coaxial line in FIG. 6.

Thus, when the first subassembly is positioned in the central opening of the body, the central conductors 211 of the coaxial lines 205 bear on the ends 60 of the central conductors of the coplanar lines, while ground plane regions 100 of the latter bear on the shoulder 219 of the metallic body constituting the ground plane of the apparatus.

The metallic body 220 may be made, for example, of brass or of gold-plated bronze.

A metallic pressure member 222 integral with the metallic body 220 by means of the series of screws 221 ensures the pressure of the front surface 12 of the rigid plate 10 on the shoulder 219 by means of a flexible insulating joint 230. This pressure ensures a good electrical contact between the central conductors 211 and 60 and a minimum coupling between the high-frequency lines. In fact, if the pressure between the ground plane regions 100 and the shoulder 219 of the metallic body should not be sufficient, the coupling between the lines would be too strong and the measurements would be distorted.

The apparatus according to the invention ensures minimum coupling between the lines and a good continuity of impedance.

The series of screws 204 holds the socket 201 on the metallic body 220.

The series of screws 221 serves both to fix the pressure member 222 on the body 220 and to form a bolt for fixing the cap 202 to the body 220.

If the dielectric plate 10 is circular, all the parts of the apparatus shown in FIG. 5 may be bodies of revolution about the axis I—I except for the package 1, the dielectric elastic plate 17 and the push-button 8.

It should further be noted that the rigid plate 10 can support in addition to the circuit of coplanar lines passive components for assisting in carrying out the measurements, such as resistors and capacitors.

What is claimed is:

1. A testing apparatus for a leadless package containing a high-frequency integrated circuit chip, said package having on a first external side thereof a first plurality of contacts arranged in a predefined pattern and being electrically connected to the integrated circuit of the chip, said apparatus comprising:
   a. a rigid dielectric plate supporting a printed circuit comprising a plurality of coplanar conductors each extending over a predetermined length from a first end thereof to a second end thereof, said coplanar conductors including pairs of spaced-apart ground-plane conductors and respective center conductors disposed therebetween, the width of the space between each pair of ground-plane conductors and of the respective center conductor having a predefined ratio which remains constant over substantially the entire length thereof and determines a predefined characteristic impedance of a respective coplanar transmission line formed thereby;
   b. contact support means insulatively supporting a second plurality of conductive contacts against which respective ones of the first ends of the coplanar conductors are pressed, said conductive contacts extending away from said first ends and being arranged in a pattern which corresponds with the predefined pattern of the leadless package contacts;

c. a plurality of coaxial transmission lines each electrically connected to the second ends of the coplanar conductors defining a respective one of the coplanar transmission lines; and d. pressure-applying means for pressing the leadless package against the contact support means with a controllable pressure, the first plurality of contacts being pressed against corresponding ones of the second plurality of contacts.

2. A testing apparatus as in claim 1 where the rigid dielectric plate includes a central opening dimensioned for freely receiving the leadless package, said first ends of the coplanar conductors of the printed circuit being disposed adjacent said opening and arranged to coplanarly align with and be closely spaced from corresponding ones of the contacts of a leadless package received in said opening, said conductors extending radially from said opening on one side of said plate.

3. A testing apparatus as in claim 2 where:

a. the contact support means comprises a relatively-thin flexible dielectric plate bearing on a front side a printed circuit forming said second plurality of conductive contacts, and further comprises a relatively-thick elastic dielectric plate for applying pressure against a back side of said flexible dielectric plate; and b. the pressure-applying means comprises a first pressure-applying system including a rigid pressure plate for supporting the elastic dielectric plate and pressure-producing means for pressing said rigid plate against said elastic dielectric plate, and further comprises a second pressure-applying system including a rigid pressure member for pressing one of the leadless packages against the contact support means and adjustable pressure-producing means acting against the rigid member for controlling the pressure applied to said package by said member.

4. A testing apparatus as in claim 2 or 3 comprising:

a. a hollow metallic body having first and second opposite sides to which the first and second pressure-applying systems are attached, having an inner surface defining a central hollow in which the rigid pressure plate of the first system and the rigid pressure member of the second system are disposed opposite each other, having a shoulder formed on said inner surface for supporting the rigid dielectric plate with the ground-plane conductors in contact therewith, and having a plurality of openings extending therethrough from the inner surface to an outer surface of the body, said openings holding respective ones of the coaxial transmission lines with center conductors of said lines in contact with respective ones of the second ends of the coplanar conductors on the rigid dielectric plate; and b. pressure-applying means for pressing the dielectric plate against the shoulder and the center conductors.

5. A testing apparatus as in claim 1, 2 or 3 where the rigid dielectric plate consists essentially of a ceramic material.

6. A testing apparatus as in claim 1, 2 or 3 where the rigid dielectric plate is circular.

7. A testing apparatus as in claim 4 where the hollow metallic body is circular.

8. A testing apparatus as in claim 1, 2 or 3 where the rigid dielectric plate supports passive electronic components.

* * * * *